United States Patent [19]

Behan

[11] Patent Number: 5,508,657

[45] Date of Patent: Apr. 16, 1996

[54] FEED FORWARD CANCELLATION AMPLIFIER UTILIZING DYNAMIC VECTOR CONTROL

[75] Inventor: Scott T. Behan, Oxnard, Calif.

[73] Assignee: AML Communications, Inc., Camarillo, Calif.

[21] Appl. No.: 380,042

[22] Filed: Jan. 30, 1995

[51] Int. Cl.$^6$ .................... H03F 3/66; H03F 1/26
[52] U.S. Cl. .................... 330/151; 330/52; 330/149
[58] Field of Search .................... 330/52, 149, 151; 332/159, 162

[56] References Cited

U.S. PATENT DOCUMENTS

| | | | |
|---|---|---|---|
| 3,922,617 | 11/1975 | Denniston et al. | 330/149 |
| 5,323,119 | 6/1994 | Powell et al. | 330/151 |
| 5,396,189 | 3/1995 | Hays | 330/149 |

OTHER PUBLICATIONS

1992 Merrimac Catalogue, West Caldwell, New Jersey Sections 2.1 to 2.4, entitled: "Complex Modulators and Demodulators (I & Q Networks) 10 to 8,000 MHz".

Primary Examiner—Steven Mottola
Attorney, Agent, or Firm—Gene W. Arant

[57] ABSTRACT

A feed forward cancellation amplifier system for amplifying radio frequency telephony signals, including a main amplifier, an error correction circuit producing a message error signal, an error amplifier for producing an amplified message error signal that is then subtracted from the amplified and distorted message signal output of the main amplifier prior to a final output circuit, a negative feedback circuit responsive to a test signal for compensating and minimizing variation or drift in the operation of the error amplifier, the error correction circuit including a vector modulator responsive to modified quadrature vector components of the message error signal for producing a single voltage vector error signal, and the negative feedback circuit including an I & Q network for modifying the quadrature vector components of the error signal in the error correction circuit.

The preferred form of the invention utilizes PIN diodes to provide voltage controlled attenuators in the vector modulator.

An auxiliary negative feedback circuit is also provided for compensating variation or drift of the main amplifier.

11 Claims, 5 Drawing Sheets

FEED FORWARD CANCELLATION AMPLIFIER UTILIZING DYNAMIC VECTOR CONTROL

BACKGROUND INFORMATION

Error correction of amplifiers grows ever more important as frequency allocation, frequency reuse, and RF interference (RFI) become more prevalent. All amplifiers produce distortion products, or error signals, as a part of the amplification process. The amount of error varies, but is primarily due to the operational class of the amplifier. Class C amplifiers, while very efficient, generate significant error signals. Class AB amplifiers operate somewhat less efficiently, producing less error than a Class C amplifier operating at similar power levels. Class A amplifiers provide the lowest level of error signal, but at a higher cost such that the power efficiency of the amplifier is very poor. As a tradeoff, one can use a Class AB amplifier for a specific application such as wireless telephony transmission, and utilize associated circuitry operating in the feed forward cancellation mode for reducing the error components generated by the amplifier. This provides reduced error levels at a reasonable level of operational efficiency.

The feed forward error control concept was originated in the 1920's by Harold S. Black and described in his U. S. Pat. No. 1,686,792 issued Oct. 9, 1929. The concept is more fully described in an article entitled "A Microwave Feed-Forward Experiment", by H. Seidel, published in The Bell System Technical Journal, Vol. 50, No. 9, November, 1971. Its important properties are that it incorporates time, phase and amplitude compensation to reduce error signals produced by the amplifier. Compensation of these three parameters allows operation at much higher frequencies, and over much greater bandwidths, than other types of error control such as negative feedback. Also, because time compensation is incorporated into the system, the ultimate performance of the system becomes dependent upon the physical component variations, and not upon limitations due to transit time and associated phase shift through the system.

The feed forward amplification process involves signal amplification, recognition and amplification of the undesired signals (errors), and combination of properly compensated error signals with the distorted amplifier output signal (herein, "amplified and distorted message signal") so as to produce a corrected final output signal in which the level of the error signals is reduced by cancellation or destructive interference. Associated circuitry includes an error correction circuit for detecting message signal error in the operation of the main amplifier and producing an amplified message signal error which is then subtracted from the amplified and distorted message signal output of the main amplifier to produce a corrected final output signal.

SUMMARY OF THE INVENTION

The present invention provides a feed forward cancellation amplifier system for amplifying radio frequency telephony signals which includes a main amplifier, an error correction circuit including an error amplifier for producing an amplified message signal error that is then subtracted from the amplified and distorted message signal output of the main amplifier prior to a final output circuit, and a negative feedback circuit for compensating and minimizing variation or drift in the operation of the error amplifier. A particular feature of the present invention is that the message signal error is broken into quadrature components whose amplitudes are dynamically and independently controlled by the negative feedback circuit before they are combined into a single vector error signal which is then amplified before its application to a near-final output circuit.

A particular feature of the invention involves the use of PIN diodes to modify the quadrature components of the message signal error so as to produce a modified vector error signal prior to its amplification.

DRAWING SUMMARY

DETAILED DESCRIPTION OF PREFERRED EMBODIMENT

(FIGS. 1-4)

General Description

Figure 1:
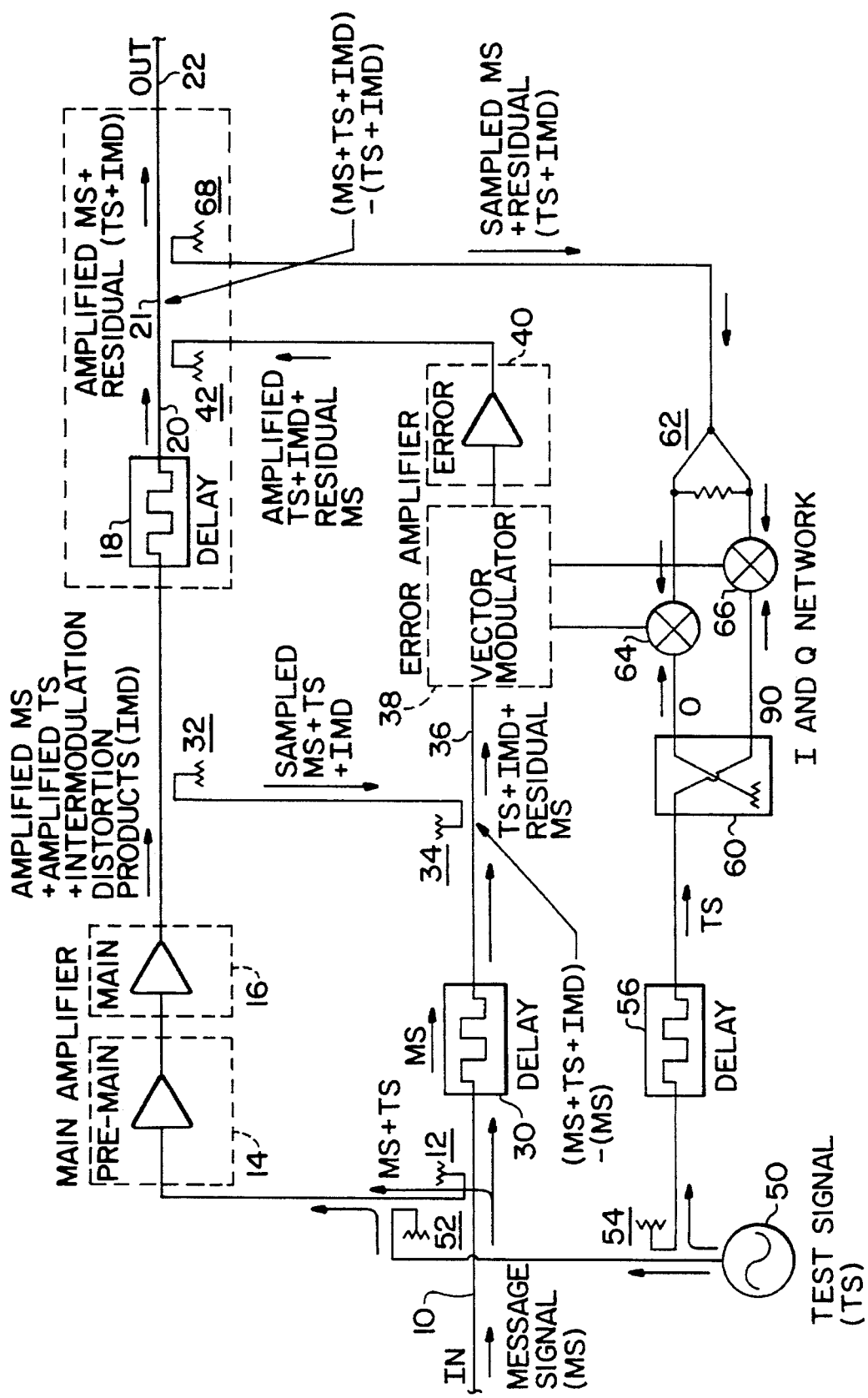
FIG. 1 is a schematic circuit diagram of a feed forward cancellation amplifier system having an associated negative feedback circuit for compensating the operation of the error amplifier in accordance with the presently preferred form of the invention.

In general, the amplifier system of the present invention includes a main amplifier, and a feed forward cancellation circuit which includes an error correction circuit containing an error amplifier for producing an amplified message signal error that is then subtracted from the amplified and distorted message signal output of the main amplifier in a near-final output circuit. A negative feedback circuit for compensating and minimizing variation and drift in the operation of the error amplifier is also provided. These features of the system are shown in FIG. 1. A vector modulator is a very important component of the negative feedback circuit which is shown schematically in FIG. 2, and the details of its structure are shown in FIGS. 3 and 4.

Figure 3:
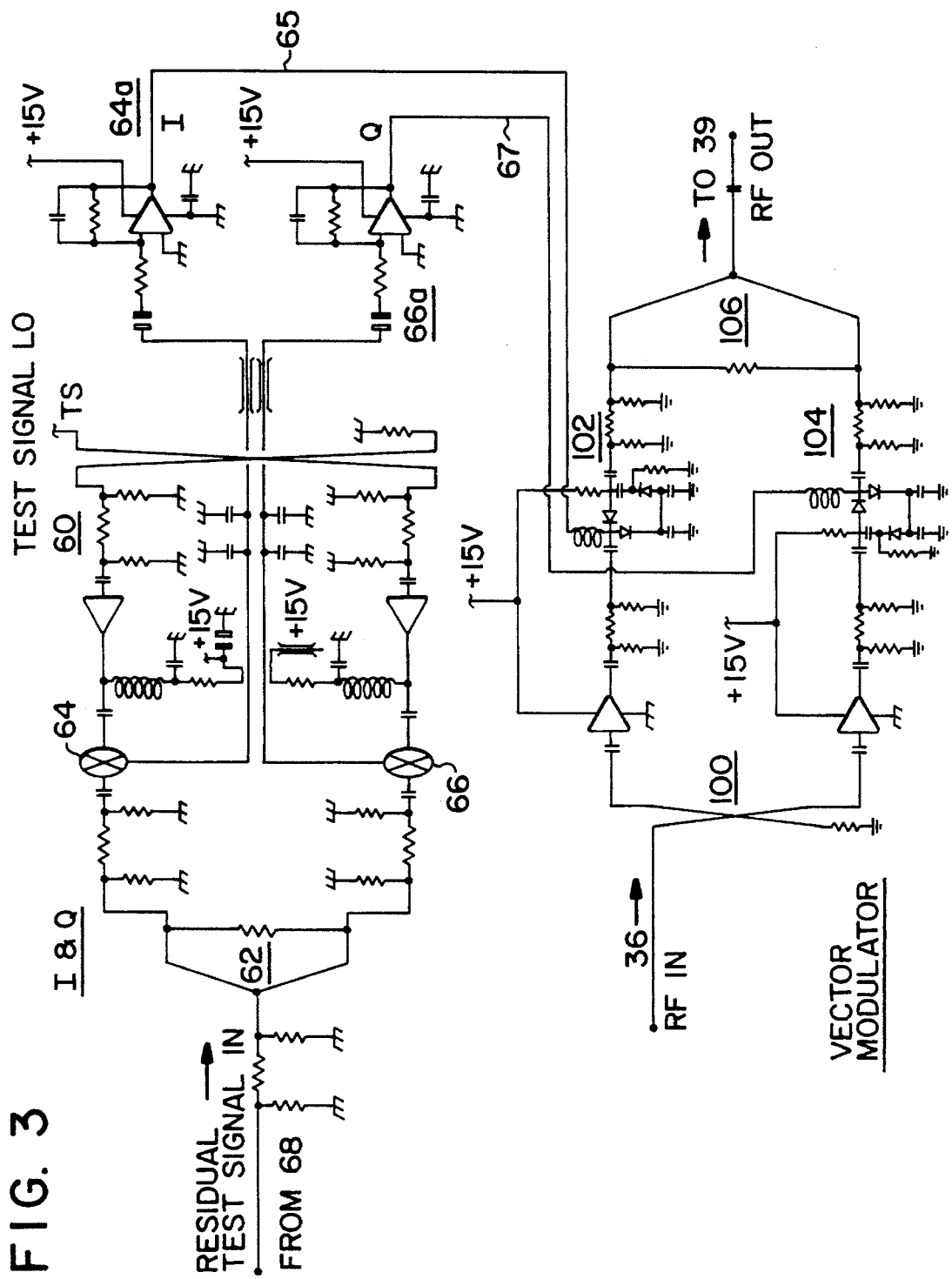
FIG. 3 is a schematic circuit diagram of the presently preferred form of the vector modulator and its associated control circuitry in accordance with the invention.
Figure 4:
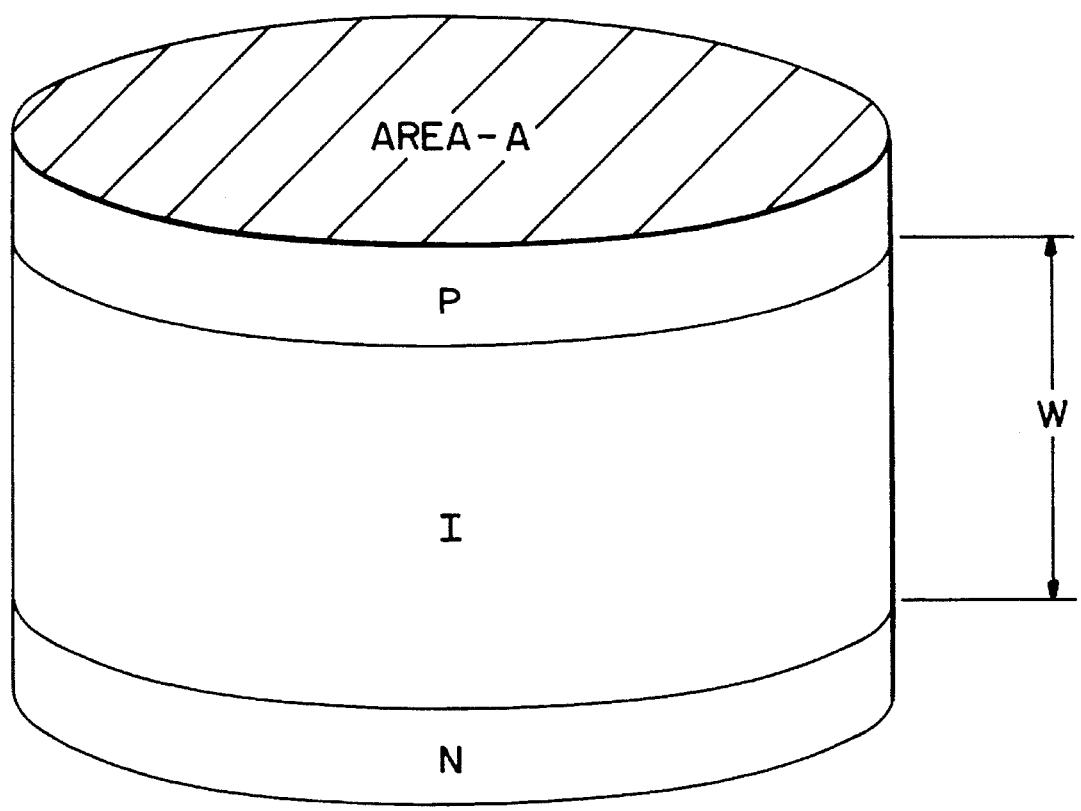
FIG. 4 is a schematic showing of a PIN diode used in the vector modulator circuit.

FIG. 3 illustrates in detail the circuitry of the vector modulator and an associated in-phase and quadrature phase (I and Q) network that controls its operation.

Figure 2:
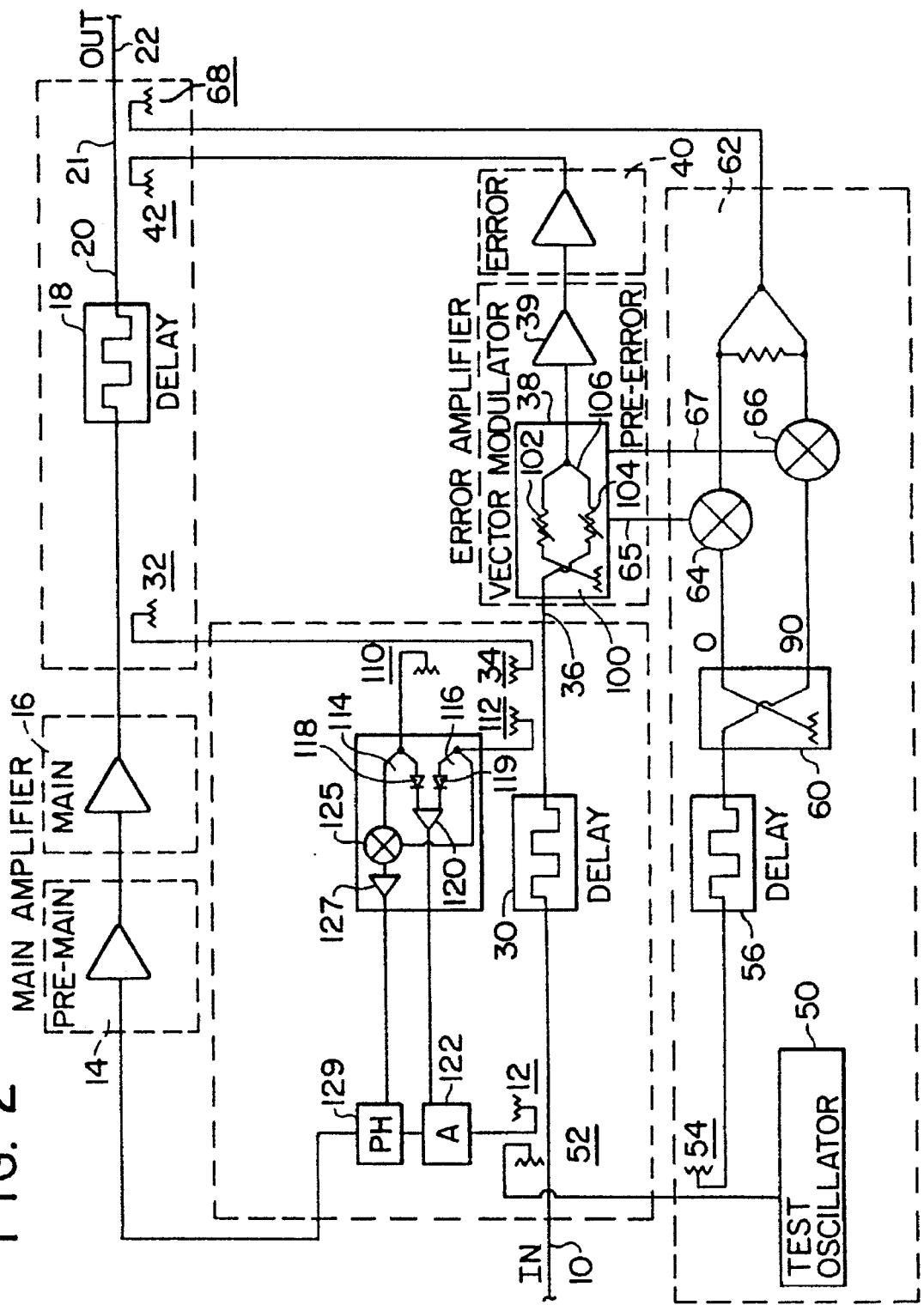
FIG. 2 is a more detailed schematic circuit diagram which also illustrates the preferred inclusion of an auxiliary negative feedback circuit for compensating operation of the main amplifier.

FIG. 2 additionally shows in schematic form an auxiliary negative feedback circuit for compensating operation of the main amplifier.

For easier understandability of the circuitry and its operation, the following sequence of explanation will be followed. Paragraphs I through IV describe the operation of the basic feed forward cancellation circuitry.

I. The operation of the main amplifier circuit in respect to amplification of the input message signal.

II. The operation of the error detection circuit loop in detecting error in the amplified and distorted message signal output of the main amplifier by comparison with the input message signal.

III. The operation of the error amplification circuit in amplifying the message error signal.

IV. The combining of the amplified message error signal with the amplified and distorted message signal (in inverted phase) to provide a corrected near-final output signal.

The following Paragraphs V through VIII describe the dynamic vector control implementation in accordance with the present invention.

V. The operation of the test oscillator in producing a test signal supplied to the main amplifier path, only, of the message signal channel.

VI. Operation of the test signal detection circuit loop in detecting presence of the test signal in the corrected final output signal.

VII. The vector modulator circuit and its dynamic operation.

VIII. The I & Q network and its operation in measuring test signal final output and in response thereto controlling dynamic operation of the vector modulator.

Additional features are described in Paragraphs IX and X.

IX. Structure and operation (FIG. 2) of an auxiliary negative feedback circuit that compensates operation of the main amplifier.

X. ALTERNATE CIRCUIT EMBODIMENT

I. OPERATION OF MAIN AMPLIFIER CIRCUIT

The main amplifier circuit, best seen in FIG. 1, includes a message signal input 10 to which a message signal is applied, the signal typically being a group of radio frequency telephony signals that are to be processed concurrently.

The input message signal MS applied to message input 10 passes through a coupling 12 to a pre-amplifier stage 14 and a main amplifier stage 16 of a radio frequency high power amplifier operating in Class A B. A power amplifier is utilized that operates at high energy efficiency but with measurable signal distortion. The message signal is then amplified by the RF power amplifier 14, 16, resulting in an amplified and distorted version of the input message signal which includes error introduced during the amplification process. In the common situation where multiple frequencies are being processed at the same time, the distortion or message signal error IMD is typically due to cross-modulation of the different frequency signals as a result of nonlinearity of circuit operation. The amplified and distorted message signal then passes through a time delay element 18, whose purpose will be later explained, and to message signal output 20.

From message signal output 20 the amplified and distorted message signal passes through a combiner 42 where an amplified message error signal, of substantially equal amplitude and substantially opposite phase, is added to it. The combined signal which appears at the near-final output 21 then constitutes a corrected near-final output signal.

II. OPERATION OF THE ERROR DETECTION CIRCUIT LOOP

The error detection circuit loop compares input and output of the RF power amplifier 14, 16, to create a message error signal indicative of the errors and distortion occurring in the main amplifier. The input message signal, with some attenuation at 12, passes through a delay device 30 before reaching a summing device 34. A sample of the amplified and distorted message signal is taken from the output of the power amplifier 14, 16, also with some attenuation, through a coupler 32 and also applied to the summing device 34 where it is combined with the sample of the input message signal.

The purpose of the time delay element 30 is to compensate for the signal transit time through the RF power amplifier path and the associated path leading to summing device 34. The signals are combined in the summing device 34 in such a way that the sample of the amplified and distorted message signal, and the sample of the input message signal, are of substantially equal amplitudes, but substantially opposite in phase, resulting in destructive interference which significantly reduces the level of the message signal at the output of the combiner 34, but leaving the message error signal present at location 36 as shown in FIG. 1.

III. OPERATION OF THE ERROR AMPLIFICATION CIRCUIT

The message error signal passes from the summing device 34 along signal line 36 through a control network including vector modulator 38 to a Class A radio frequency amplifier 40 where the message error signal is amplified with minimal generation of additional distortion. For proper operation of the feed forward cancellation amplifier system, the error amplification circuit needs to produce an amplified message error signal at the output of amplifier 40 that may then be subtracted from the time-delayed amplified and distorted message signal at 42 so as to destroy the errors. In order to achieve that result the amplified message error signal must have the appropriate amplitude, phase, and time delay relative to the time-delayed amplified and distorted message signal with which it is to be combined.

The vector modulator 38 operates by attenuating the two orthogonal components of the message error signal received at 36, which are then combined into a single vector. It would be possible to operate the vector modulator 38 by setting fixed parameters for attenuation of the two orthogonal components of the message error signal, but such a static method of control would not fully compensate dynamic operation of the feed forward cancellation amplifier. According to the present invention the control of vector modulator 38 is accomplished dynamically, as described in later paragraphs.

IV. COMBINING AMPLIFIED MESSAGE ERROR SIGNAL WITH AMPLIFIED AND DISTORTED MESSAGE SIGNAL TO PROVIDE NEAR-FINAL OUTPUT SIGNAL

The amplified message error signal proceeds from error amplifier 40 to a coupler 42 where it is coupled to the output path of the delay device 18, and is combined with the time-delayed amplified and distorted message signal but in opposite phase relation. The combined signal constitutes a corrected near-final output signal which appears at near-final output 21.

The amplitude of the message error signal flowing through the error signal amplification path 32, 34, 36, 38, 40, 42, is adjusted at amplifier 40 such that it is substantially equal to the amplitude of the message signal error contained in the time-delayed amplified and distorted message signal received from the delay device 18. The time delay through device 18 as it appears at 20 is selected to compensate for signal transit time through the error signal amplification path 32, 34, 36, 38, 40, 42. The phase of the error signal path is set such that it is substantially opposite that of the time delayed path 32, 18, 20, with the result that the amplified message error signal is then combined with the message signal error in the coupler 42, destructively interfering with and significantly reducing the level of the message signal error present at the near-final output 21 of the amplifier system.

Thus the error detection circuit loop in conjunction with the error amplification circuit provides an amplified message error signal that is then subtracted from the time-delayed amplified and distorted message signal output of delay device 18 so as to substantially destroy the message signal errors occurring in the RF power amplifier.

V. NEGATIVE FEEDBACK CIRCUIT—APPLYING A TEST SIGNAL TO THE MESSAGE SIGNAL PATH

The general theory of operation of a negative feedback circuit utilizing a test signal and test signal detection circuit loop is described in the article by Seidel, cited above.

A test signal generator 50 as shown in FIG. 1 generates a test signal TS both to measure the performance of the error detection circuit loop and error amplification circuit, and to compensate for any variation or drift in that performance. Where the amplifier system is adapted to operate over two separate frequency bands, as is typical in cellular telephone circuitry, it is advantageous to select a test signal frequency that lies in the band not currently used for the message signal. That choice avoids any significant interaction of the test signal with the message signal. However, the test signal may also be selected to lie within the operating band of frequencies, since it will be detected at the final output by an appropriate frequency selection circuit.

The test signal TS is applied through a coupler 52 to the RF power amplifier input and hence passes all the way through the main amplifier path of the feed forward cancellation amplifier. From coupler 52 it passes to the input of pre-amplifier 14, and passes through circuit elements 16, 18, 20, 42, 21, and 68 to the final output 22. It will thus be noted that the test signal is operated upon in the message signal circuit similarly to the message signal itself, but not in the same way because no time-delayed version of the test signal TS is presented to the combiner 34. The combiner 34, therefore, permits whatever proportion of the test signal TS and the amplified and distorted message signal (MS+IMD) was sensed at the coupler 32 to pass into the error amplification circuit. The combiner 34 is not a perfect device and hence there is some loss of signal amplitude of both the message error signal and the test signal in passing through it.

VI. OPERATION OF TEST SIGNAL DETECTION CIRCUIT LOOP

The test signal detection circuit loop through coupler 68 operates to detect the presence of the test signal, if any, in the corrected near-final output signal.

The test signal TS provided by the test signal generator 50 is also applied through a coupler 54 and a delay device 56 to an I & Q network 60, 64, 66, 62. Prior to the final output 22, where the time-delayed amplified and distorted message signal has been corrected by subtracting the amplified message error signal, the corrected near-final output signal is sampled through coupler 68, and that signal sample is provided to a signal splitter 62 forming part of the I & Q network. Although coupler 68 is a broad frequency band device, the operation of the I & Q network is such as to compare only the signals received at the test signal frequency.

Hypothetically, it would be possible to have zero amplitude of the test signal TS appearing at the final output 22. That could happen if the amplitude of the test signal as delivered through combiner 42 were exactly equal to that of the test signal passing through delay device 18, and the phase relationship of those same two signals were exactly opposite, resulting in complete cancellation. Therefore, the purpose of coupler 68 and the associated test signal detection circuit loop is to determine whether any amplitude of the test signal exists at near-final output 21, immediately prior to the coupler 68. If a measurable test signal output is present there, that indicates that the circuit loop 32, 34, 36, 38, 40, 42, 18, 20, is not operating at optimum level.

The corrected final output signal at 22 would differ from the near-final output signal only in a reduction in signal amplitude due to the signal picked off at 68.

VII. THE VECTOR MODULATOR CIRCUIT AND ITS DYNAMIC OPERATION (FIGS. 2–4)

The negative feedback compensating circuit involves maintaining the amplified message signal error at appropriate amplitude and phase levels such that optimum message signal error cancellation is obtained.

Because the error amplifier transfer function will vary with time and temperature, and due to the tight phase and gain restrictions required to maintain substantial message signal error cancellation at the near-final output, a method of correction is implemented to monitor and correct for deviations in error amplifier performance. This correction network is known as a vector modulator. The vector modulator is described, for example, in a 1992 catalog published by Merrimac, a manufacturer of electronic products located at West Caldwell, N.J.

Vector modulator 38 operates on orthogonal or complex components of the message error signal received on line 36. It ms in turn controlled by orthogonal voltage signals developed in the I & Q network, as later described. Referring now specifically to FIG. 2, the vector modulator 38 includes a 90 degree quadrature hybrid circuit 100 having two outputs, a first electronically variable signal attenuator 102 being connected to one of its outputs and a second electronically variable signal attenuator 104 being connected to its other output. The outputs of the two attenuators are combined by a power combiner 106, whose output is therefore a vector error signal. That vector error signal is fed to a pre-amplifier 39 whose output drives the input of error amplifier 40. From the output of error amplifier 40, therefore, an amplified vector signal error or modified message signal error is supplied to the coupler 42.

A particular feature of the present invention is the use of only amplitude control to modify vector information of the message error signal. The vector modulator 38 derives the orthogonal components of the message error signal from the path 36, at phase angles of +45 degrees and −45 degrees, and operates to modify the amplitude of one or both orthogonal components in one quadrant prior to combining the modified orthogonal component vectors to provide a modified vector error signal. Modification of the amplitude of each orthogonal component of the message error signal is achieved by varying a voltage that is applied to its associated electronically variable signal attenuator. Each of these attenuators 102, 104, comprises a PIN diode and resistor network. The use of PIN diodes is significant because they can be sized such that they will produce minimal additive distortion.

A PIN diode is a semiconductor device that operates as a variable resistor at RF and microwave frequencies. Its construction, illustrated in FIG. 4, is similar to an ordinary PN junction diode except that there exists a region of intrinsic semiconductor (I) of width W between the P and the N regions of the device. It is this I region Width and the cross sectional area A which significantly affect the PIN diode characteristics. The resistance of the PIN diode is determined by the quantity of dc current applied through it. The distortion produced by the PIN diode is a function of the physical implementation of the device. Improved distortion characteristics can be achieved by choosing a PIN diode with a larger I region width or by using multiple PIN diodes.

Details of PIN diode physics and application are described in a 1984 Catalog of Unitrode Corporation located at Lexington, Mass.

The above described vector modulator operates over a single quadrant of a four quadrant system. Each of the component vectors can only be modified in amplitude, there being no provision to change the polarity of the amplitude, or to provide a vector of similar amplitude variation but opposite in phase. This requires the performance of the system to be set to have its nominal performance in the middle of the quadrant of operation. It is significant that the impedance of the vector modulator can be closely matched with its load impedance over a substantial signal dynamic range thus producing a very small voltage standing wave ratio (VSWR).

Advantages

The Vector Modulator Control signals are directly derived from an I and Q network so that there is no signal translation required. The I and Q vector modulator provides Wide band performance and maintains good VSWRs (Voltage Standing Wave Ratios) over a high dynamic range. Because it uses only passive components and PIN Diode type attenuators, it provides excellent linear (non-distortion producing) performance at high power levels, unlike many varactor diode controlled products. An alternative arrangement described in Par. X provides continuous four quadrant vectorial correction.

VIII. THE I & Q NETWORK IN MEASURING TEST SIGNAL FINAL OUTPUT AND IN RESPONSE THERETO CONTROLLING DYNAMIC OPERATION OF THE VECTOR MODULATOR (FIGS. 2 & 3)

The I & Q network includes a quadrature hybrid circuit 60 which responds to the test signal TS to produce two signals in phase quadrature, at +45 degrees and −45 degrees, each with an amplitude of nominally 70.7% of the input test signal. Those phase quadrature signals are applied to mixer or multiplier circuits 64 and 66, respectively, as Local Oscillator (LO) signals. The I & Q network also includes a power divider 62 which divides the sampled near final output signal into two equal phase, equal amplitude signals which are also applied to mixer circuits 64 and 66. The I&Q network is described, for example in a 1992 catalog published by Merrimac, a manufacturer of electronic products located at West Caldwell, N.J.

The desired output signals of these mixers is the D.C. voltage component due to the mixing (multiplying) of the LO signals with the test signal component of the near-final output sampled at (68). Higher frequency mixer output signal components produced by the mixing of other than test frequency signals with the LO signals are substantially reduced in amplitude by low pass filters at the mixer outputs. Because of the 90 degree difference between the LO signals entering the mixer, the D.C. output of each mixer is at least somewhat linearly related to the amplitude of the quadrature components of the sampled test signal present at 68.

Each mixer output is applied to an operational amplifier whose reference is zero volts. The difference between each mixer output and its reference is amplified to produce a control voltage. These control voltages are applied to the corresponding attenuators of the quadrature components of the message error signal.

Thus as specifically shown in FIG. 3 the residual test signal derived from the signal sample at 68 is applied to signal splitter 62 which drives mixers 64 and 66. The test signal TS derived from test oscillator 50 through the delay device 56 is applied to the quadrature hybrid circuit 60 which responds to the test signal TS to produce two phase quadrature signals that are also applied to mixer or multiplier circuits 64 and 66, respectively, as Local Oscillator (LO) signals. The output of mixer 64 passes through a low pass filter 64a to provide a control signal input on line 65 to the vector modulator circuit. Similarly, the output of mixer 66 passes through a low pass filter 66a to provide a control signal input on line 67 to the vector modulator circuit.

Control signal 65 is applied to variable attenuator 102 that includes three PIN diodes as main operative elements, while control signal 67 is applied to variable attenuator 104 that includes three PIN diodes as main operative elements. The message error signal received on line 36 is applied through the quadrature hybrid circuit 100 having two outputs, one of whose outputs is connected to the electronically variable signal attenuator 102 while its other output is connected to the electronically variable signal attenuator 104. The phase relationships are such that each attenuator operates on one quadrature component, only, of the message error signal. The outputs of the attenuators 102, 104, are combined in the power combiner 106 whose output vector error signal is fed to the pre-amplifier 39.

IX. AUXILIARY NEGATIVE FEEDBACK CIRCUIT COMPENSATING THE MAIN AMPLIFIER OPERATION

The circuit of FIG. 2 also illustrates an auxiliary negative feedback circuit for compensating and stabilizing the main amplifier operation, which is believed to be generally conventional in its structure and operation. Two difference signals are obtained, one for amplitude comparison and one for phase comparison. These difference signals are then inserted into the main signal path through appropriate control devices.

A coupler 110 receives a sample of the amplified and distorted message signal from the coupler 32 and applies it to the input of a signal splitter 114. A coupler 112 receives a sample of the delayed input message signal from the output side of delay device 30 and applies it to the input of a signal splitter 116. The couplers 110 and 112 operate in opposite phase sense such that the delayed input message signal is subtracted from the amplified and distorted message signal. These signals are used to stabilize or compensate the operation of the main amplifier against variations or drift in its operation.

An amplifier 120 receives an input signal through a diode 118 from the signal splitter 114, and another input signal through a diode 119 from the signal splitter 116. The amplifier 120 produces an output voltage level proportional to the amplitude difference between the sampled amplified and distorted message signal and the delayed input message signal. The output of amplifier 120 is then provided to an amplitude adjustment circuit 122 which is connected in series relationship between the coupler 12 and the pre-amplifier 14.

A mixer 125 receives an input signal from the signal splitter 114 and another input signal from the signal splitter 116. Because of the opposite phase sense of couplers 110 and 112, the mixer 125 then produces an output voltage level proportional to the phase difference between the sampled amplified and distorted message signal and the delayed input message signal. The output of mixer 125 is then provided to a phase adjustment circuit 129 which is also, along with the amplitude adjustment circuit 122, connected in series relationship between coupler 12 and the pre-amplifier 14.

X. ALTERNATE CIRCUIT EMBODIMENT

Figure 5:
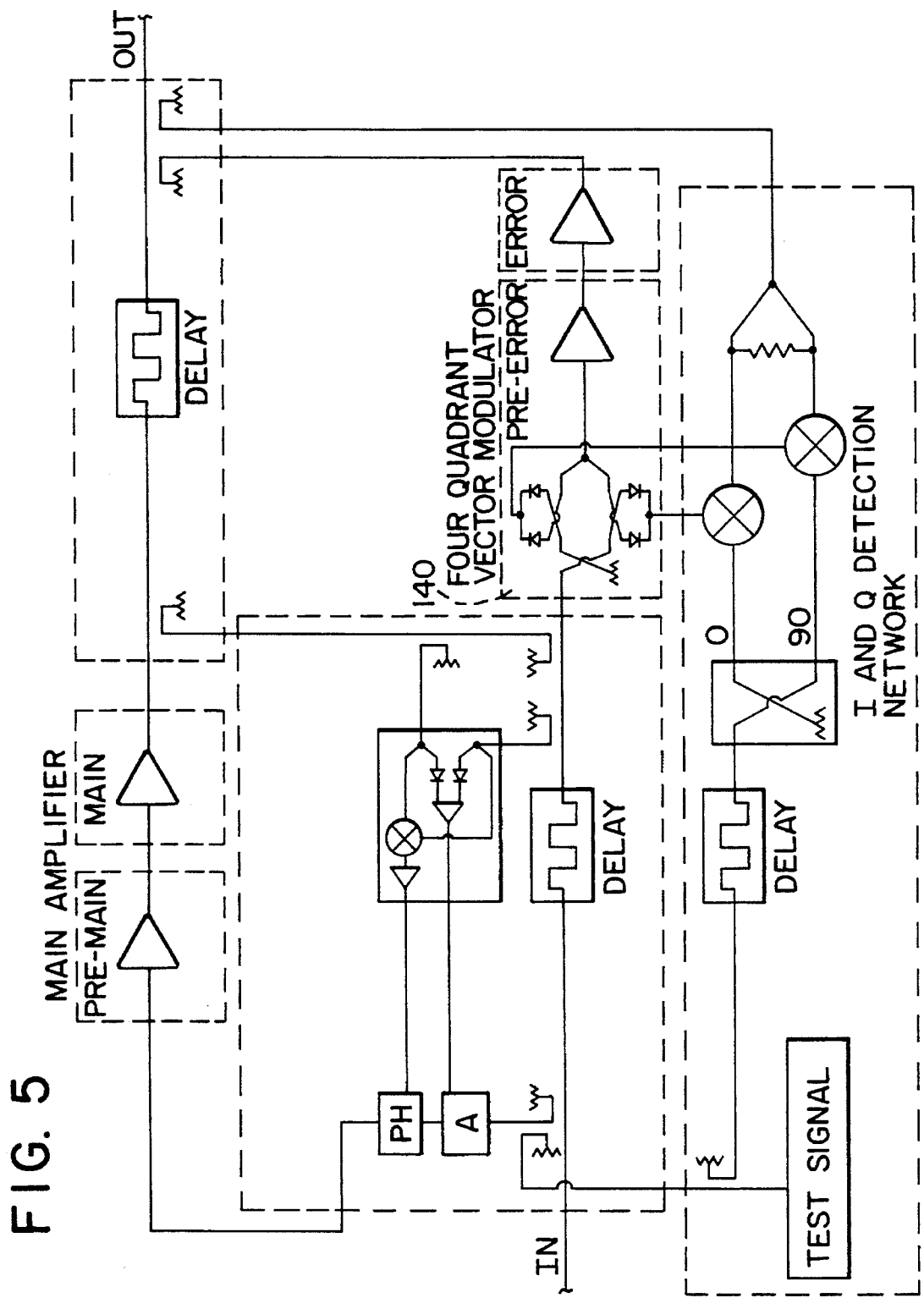
FIG. 5 is a schematic circuit diagram of an alternate form of the invention.

An alternative to the Vector modulator presented above is to use attenuators which provide either a positive or a negative polarity signal and vary the amplitude. This comprises three quadrature phase power dividers, 4 PIN diodes, and a power summer. This type of vector modulator allows a full 360 degree continuous range of message error signal control along with the associated amplitude control. This eliminates the possibility that the system will drift beyond it quadrant of operation and into an undesirable, non-error reducing condition. Such a circuit is illustrated in FIG. 5 and particularly at reference numeral 140.

The presently preferred embodiment of the invention has been described in considerable detail in order to comply with the patent laws. However, the scope of the invention is to be determined only in accordance with the appended claims.

What I claim is:

1. An error correction circuit for modifying an error signal in response to a control signal, comprising:

a vector modulator including a first quadrature hybrid circuit having an input and a pair of outputs, a pair of voltage controllable attenuators coupled to respective outputs of said first quadrature hybrid circuit, and a power combiner having a pair of inputs coupled to respective ones of said attenuators, said power combiner also having an output;

means for applying the error signal to said input of said first quadrature hybrid circuit so as to produce the modified error signal at said output of said power combiner;

an I & Q network including a power divider circuit having an input and two outputs, a pair of mixers coupled to respective outputs of said power divider, and a second quadrature hybrid circuit having two outputs also coupled to respective ones of said mixers, said second quadrature circuit also having an input;

circuit means coupling the outputs of said mixers to respective ones of said voltage controllable attenuators;

means for applying said control signal to said input of said power divider circuit; and means for applying a test signal of predetermined frequency to said input of said second quadrature hybrid circuit for mixing with said control signal at said predetermined frequency to thereby control the modification of the error signal.

2. An error correction system including the error correction circuit of claim 1, and further comprising:

a circuit whose response is to be tested;

means for generating the test signal of predetermined frequency;

means for applying the test signal of predetermined frequency to said circuit whose response is to be tested; and means for deriving from said circuit whose response is to be tested a residual portion of the test signal that is indicative of the circuit response, said residual signal portion then serving as the control signal.

3. An error correction system as in claim 2 wherein said circuit whose response is to be tested is a feed forward cancellation amplifier.

4. An error correction circuit as in claim 1 which includes a pair of low pass filter circuits coupling the outputs of said mixers to respective ones of said voltage controllable attenuators.

5. An error correction circuit as in claim 2 which includes a pair of low pass filter circuits coupling the outputs of said mixers to respective ones of said voltage controllable attenuators.

6. An error correction circuit as in claim 3 which includes a pair of low pass filter circuits coupling the outputs of said mixers to respective ones of said voltage controllable attenuators.

7. A feed forward cancellation amplifier having a main amplifier, and an error amplifier whose response is to be tested, comprising:

means for applying a test signal of predetermined frequency to the input of the main amplifier, and deriving a residual test signal from the output of the main amplifier;

a vector modulator having an input and an output, and including a pair of voltage controllable attenuators;

means for applying an error signal to said input of said vector modulator so as to produce a modified error signal at said output thereof;

an I & Q network having two inputs, and also including a pair of mixers having outputs coupled to respective ones of said voltage controllable attenuators in said vector modulator, for modifying the error signal;

means for applying said residual test signal to one input of said I & Q network; and means for applying the test signal to the other input of said I & Q network, for mixing with said residual test signal at said predetermined frequency to thereby control the modification of the error signal.

8. An error correction circuit as in claim 7 which includes a pair of low pass filter circuits coupling the outputs of said mixers to respective ones of said voltage controllable attenuators.

9. In a feed forward cancellation amplifier system for amplifying radio frequency telephony signals which includes a main amplifier, an error correction circuit producing a message error signal, an error amplifier for producing an amplified message error signal that is then subtracted from the amplified and distorted message signal output of the main amplifier prior to a final output circuit, and a negative feedback circuit responsive to a test signal for compensating and minimizing variation or drift in the operation of the error amplifier, the improvement comprising:

said error correction circuit including a vector modulator responsive to modified quadrature vector components of said message error signal for producing a single voltage vector error signal;

said negative feedback circuit including an I & Q network for modifying said quadrature vector components of said error signal in said error correction circuit; and wherein said vector modulator includes PIN diode circuits forming attenuators for modifying said quadrature vector components of said message error signal.

10. In a feed forward cancellation amplifier system for amplifying radio frequency telephony signals which includes a main amplifier, an error correction circuit producing a message error signal, an error amplifier for producing an amplified message error signal that is then subtracted from the amplified and distorted message signal output of the main amplifier prior to a final output circuit, test signal generating means for supplying a test signal to said main amplifier so as to produce a residual test signal at the final output circuit, and a negative feedback circuit responsive to the residual test signal for compensating and minimizing variation or drift in the operation of the error amplifier, the improvement comprising:

circuit means for breaking the message error signal into quadrature vector components;

said negative feedback circuit including an I & Q network coupled to both the test signal generating means and the final output circuit and responsive to the residual test signal for producing quadrature control signals; and circuit means including a vector modulator responsive to said quadrature control signals for dynamically and independently controlling the amplitudes of said quadrature components of said error signal and combining them into a single voltage vector error signal which is then supplied to said error amplifier.

11. A feed forward cancellation amplifier system as in claim 3 wherein said vector modulator includes PIN diode circuits forming attenuators for modifying said quadrature vector components of said message error signal.

* * * * *